United States Patent
Saito et al.

(10) Patent No.: US 7,730,439 B2
(45) Date of Patent: Jun. 1, 2010

(54) FLOOR PLAN EVALUATING METHOD, FLOOR PLAN CORRECTING METHOD, PROGRAM, FLOOR PLAN EVALUATING DEVICE, AND FLOOR PLAN CREATING DEVICE

(75) Inventors: Ken Saito, Tokyo (JP); Yoshio Inoue, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 617 days.

(21) Appl. No.: 11/659,110

(22) PCT Filed: May 12, 2005

(86) PCT No.: PCT/JP2005/008709

§ 371 (c)(1),
(2), (4) Date: Feb. 1, 2007

(87) PCT Pub. No.: WO2006/120745

PCT Pub. Date: Nov. 16, 2006

(65) Prior Publication Data

US 2009/0024970 A1 Jan. 22, 2009

(51) Int. Cl.
*G06F 17/50* (2006.01)
(52) U.S. Cl. .................................. 716/8; 716/2; 716/5
(58) Field of Classification Search ............ 716/2, 716/4–5, 7–10
See application file for complete search history.

(56) References Cited

U.S. PATENT DOCUMENTS

2006/0117288 A1* 6/2006 Katagiri ..................... 716/8

FOREIGN PATENT DOCUMENTS

| JP | 9-128414 | 5/1997 |
|---|---|---|
| JP | 2001-134621 | 5/2001 |
| JP | 2004-13432 | 1/2004 |
| JP | 2004-334565 | 11/2004 |

OTHER PUBLICATIONS

Hayakawa, Jiro et al., "VLSI no Floor Plan Saitekika ni Okeru Kai no Hyoka Hoho ni Tsuite", Journal of the Institute of Science and Engineering, Chuo University, vol. 2002, No. 8, pp. 31-41, Mar. 31, 2003, Internet <URL:http://www.ise.chuo-u.ac.jp/TISE/pub/journal08>.

* cited by examiner

*Primary Examiner*—Paul Dinh
(74) *Attorney, Agent, or Firm*—Oblon, Spivak, McClelland, Maier & Neustadt, L.L.P.

(57) ABSTRACT

A floor plan evaluation method by which a floor plan can be quantitatively evaluated. The floor plan evaluation method includes first extracting a plurality of specified elements, which are specified in advance from data on a floor plan which is made automatically by, e.g., a floor planner, second obtaining an individual evaluation value on each of a plurality of individual evaluation items on the basis of the plurality of specified elements extracted in the first step, and third calculating an integrated evaluation value on the floor plan on the basis of a plurality of individual evaluation values obtained in the second step. Then, a plurality of integrated evaluation values obtained by executing the first to third operations for a plurality of floor plans are compared with one another to relatively evaluate the plurality of floor plans.

7 Claims, 11 Drawing Sheets

F I G . 2
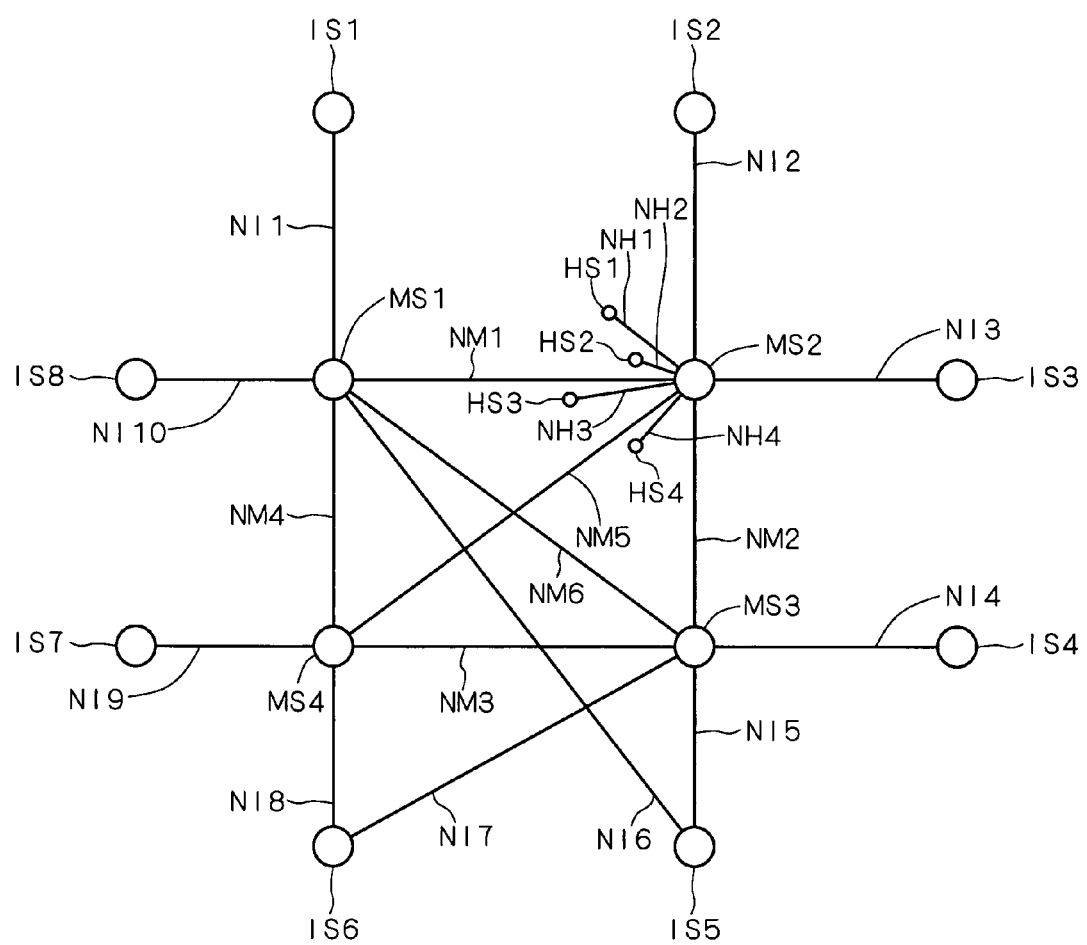

F I G . 3
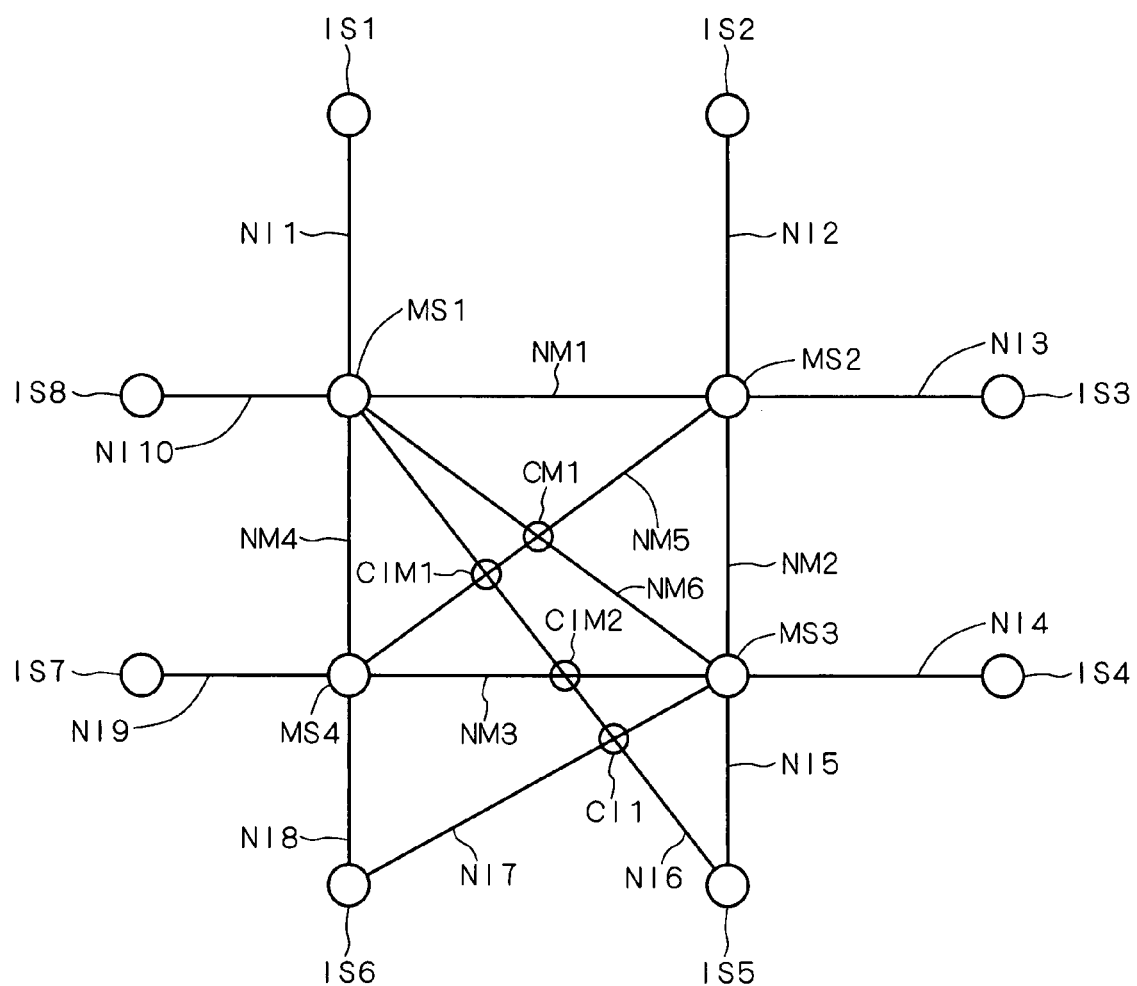

F I G . 4
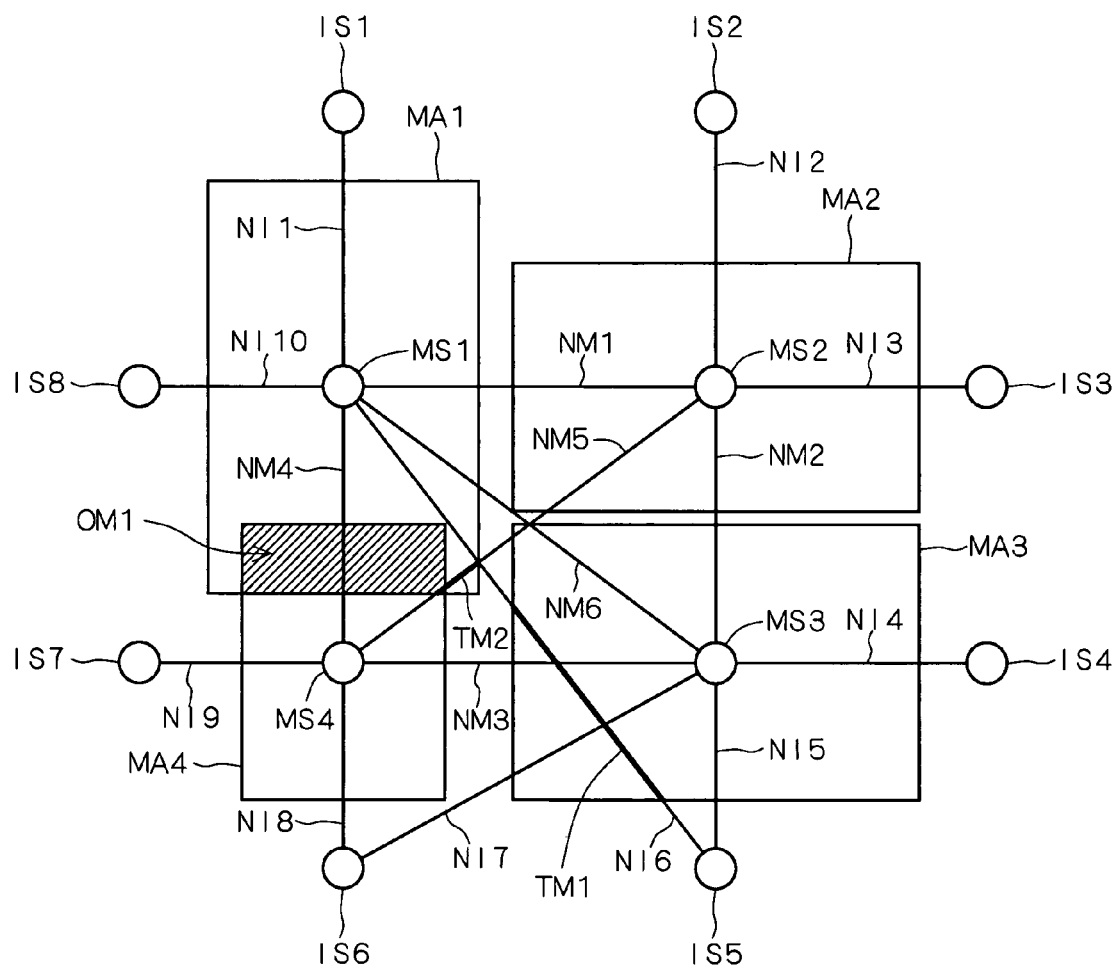

F I G. 5
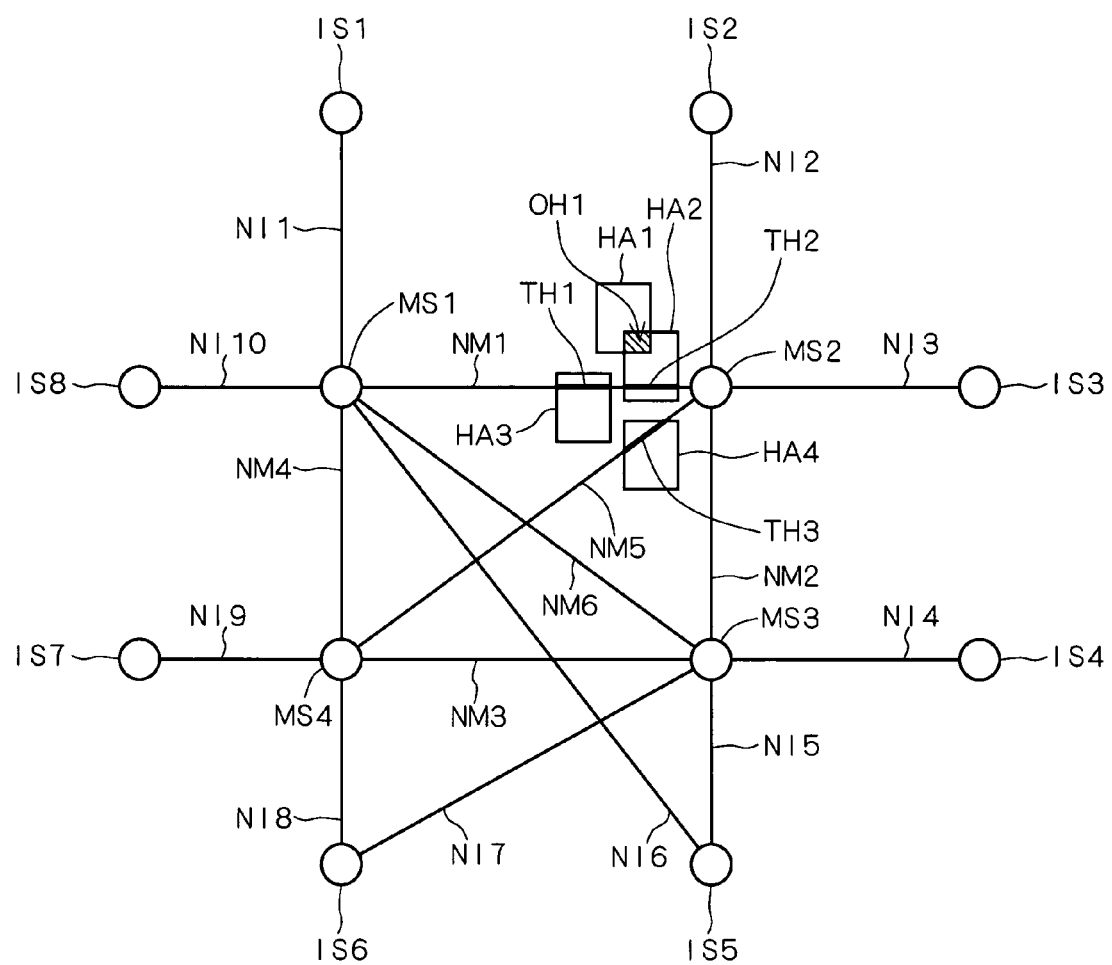

FLOOR PLAN EVALUATING METHOD, FLOOR PLAN CORRECTING METHOD, PROGRAM, FLOOR PLAN EVALUATING DEVICE, AND FLOOR PLAN CREATING DEVICE

TECHNICAL FIELD

The present invention relates to a floor plan evaluation method and a program used for performing the method, a floor plan correction method and a program used for performing the method, a floor plan evaluation device and a floor planning device.

BACKGROUND ART

Conventionally, after making a floor plan manually or automatically and performing detailed placement and routing on the basis of the floor plan which is made thus, it is checked if there is some problem of timing, degree of congestion, or the like. As the result of check, if there is some problem, the floor plan is corrected manually.

The background-art techniques on a floor planning device and a floor planning method are disclosed in, e.g., the following Patent Documents 1 and 2.

Patent Document 1: Japanese Patent Application Laid Open Gazette No. 2004-13432

Patent Document 2: Japanese Patent Application Laid Open Gazette No. 2004-334565

Now, there is no method of quantitatively evaluating a floor plan which is made. Therefore, even if it is intended to make a rough evaluation to check whether the floor plan is good or not, it is necessary to make a timing analysis or the like after performing detailed placement and routing and this disadvantageously requires much time to make an evaluation.

Further, as the result of evaluation, if it is found that the floor plan needs to be corrected, a designer has to find the problem by trial and error to correct the floor plan and this disadvantageously reduces efficiency.

DISCLOSURE OF INVENTION

The present invention is intended to solve the above problem and it is an object of the present invention to obtain a floor plan evaluation method by which a floor plan which is made can be quantitatively evaluated and a program used for performing the method, and a floor plan evaluation device. It is another object of the present invention to obtain a floor plan correction method by which a floor plan can be corrected with high efficiency and a program used for performing the method, and a floor planning device.

According to the present invention, the floor plan evaluation method includes the steps of (a) extracting a plurality of specified elements which are specified in advance from a floor plan, (b) obtaining an individual evaluation value on each of a plurality of individual evaluation items on the basis of the plurality of specified elements extracted in the step (a), and (c) calculating an integrated evaluation value on the floor plan on the basis of a plurality of individual evaluation values obtained in the step (b), and in the floor plan evaluation method of the present invention, a plurality of integrated evaluation values obtained by executing the steps (a) to (c) for a plurality of floor plans are compared with one another to relatively evaluate the plurality of floor plans.

By the floor plan evaluation method of the present invention, it is possible to quantitatively evaluate a floor plan.

According to the present invention, the floor plan correction method includes the steps of (a) extracting a plurality of specified elements which are specified in advance from a floor plan, (b) obtaining an individual evaluation value on each of a plurality of individual evaluation items on the basis of the plurality of specified elements extracted in the step (a), (c) calculating an integrated evaluation value on the floor plan on the basis of a plurality of individual evaluation values obtained in the step (b), (d) storing a plurality of individual evaluation values and a plurality of integrated evaluation values on a plurality of floor plans which are obtained by executing the steps (a) to (c) for the plurality of floor plans, (e) selecting an individual evaluation item to be corrected, out of a plurality of individual evaluation items so that an individual evaluation value on each of the individual evaluation items can approximate an optimum value among a plurality of individual evaluation values corresponding to each individual evaluation item on the basis of a storage result in the step (d), and (f) correcting a floor plan with respect to the individual evaluation item selected in the step (e).

By the floor plan correction method of the present invention, it is possible to correct a floor plan with high efficiency.

According to the present invention, the floor plan evaluation device includes a specified element extraction portion (2) for extracting a plurality of specified elements which are specified in advance from a floor plan, an individual evaluation value calculation portion (3) for obtaining an individual evaluation value on each of a plurality of individual evaluation items on the basis of the plurality of specified elements extracted in the specified element extraction portion (2), and an integrated evaluation value calculation portion (4) for calculating an integrated evaluation value on the floor plan on the basis of a plurality of individual evaluation values obtained in the individual evaluation value calculation portion (3), and in the floor plan evaluation device of the present invention, a plurality of integrated evaluation values obtained on a plurality of floor plans are compared with one another to relatively evaluate the plurality of floor plans.

The floor plan evaluation device of the present invention can quantitatively evaluate a floor plan.

According to the present invention, the floor planning device includes a floor planning portion (21), a specified element extraction portion (2) for extracting a plurality of specified elements which are specified in advance from a floor plan made in the floor planning portion (21), an individual evaluation value calculation portion (3) for obtaining an individual evaluation value on each of a plurality of individual evaluation items on the basis of the plurality of specified elements extracted in the specified element extraction portion (2), an integrated evaluation value calculation portion (4) for calculating an integrated evaluation value on the floor plan on the basis of a plurality of individual evaluation values obtained in the individual evaluation value calculation portion (3), a storage portion (11) for storing a plurality of individual evaluation values and a plurality of integrated evaluation values on a plurality of floor plans, a correction item selection portion (12) for selecting an individual evaluation item to be corrected, out of a plurality of individual evaluation items so that an individual evaluation value on each of the individual evaluation items can approximate an optimum value among a plurality of individual evaluation values corresponding to each individual evaluation item on the basis of data stored in the storage portion (11), and a floor plan correction portion (22) for correcting a floor plan with respect to the individual evaluation item selected in the correction item selection portion (12).

The floor planning device of the present invention can correct a floor plan with high efficiency.

These and other objects, features, aspects and advantages of the present invention will become more apparent from the following detailed description of the present invention when taken in conjunction with the accompanying drawings.

BRIEF DESCRIPTION OF DRAWINGS

FIGS. 2 to 6 are schematic diagrams illustrating a step of obtaining an individual evaluation value on each of a plurality of individual evaluation items in the floor plan evaluation method in accordance with the first preferred embodiment of the present invention;

BEST MODE FOR CARRYING OUT THE INVENTION

The First Preferred Embodiment

A floor plan evaluation method of the first preferred embodiment of the present invention comprises a first step of extracting a plurality of main constituent elements (hereinafter, referred to as "specified elements") which are specified in advance from data on a floor plan which is made automatically by, e.g., a floor planner, a second step of obtaining an individual evaluation value on each of a plurality of individual evaluation items on the basis of the plurality of specified elements extracted in the first step and a third step of calculating an integrated evaluation value on the floor plan on the basis of a plurality of individual evaluation values obtained in the second step. Detailed description on the individual evaluation item, the individual evaluation value and the integrated evaluation value will be made later. Then, in the floor plan evaluation method of the first preferred embodiment, a plurality of integrated evaluation values obtained by executing the first to third steps for a plurality of floor plans are compared with one another to relatively evaluate the plurality of floor plans.

Figure 14:
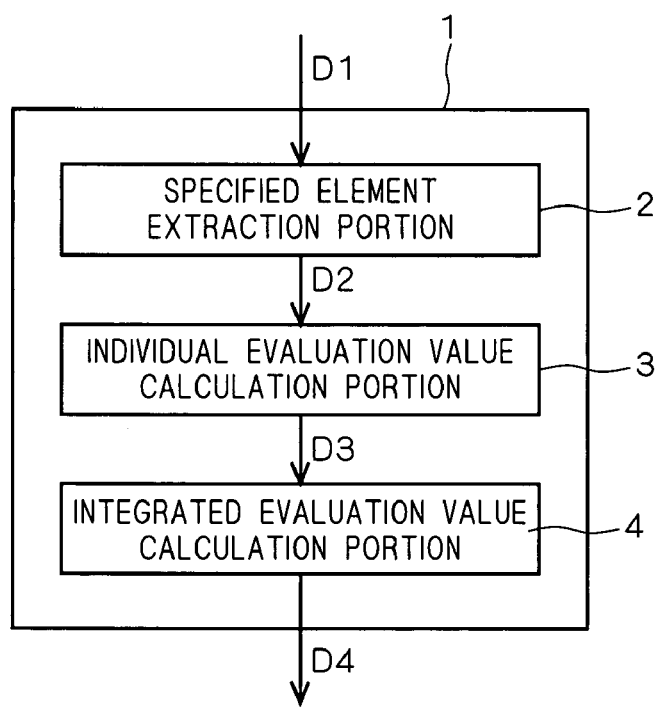
FIG. 14 is a block diagram showing a constitution of a floor plan evaluation device in accordance with the first preferred embodiment of the present invention.

FIG. 14 is a functional block diagram showing a constitution of a floor plan evaluation device 1 in accordance with the first preferred embodiment. The floor plan evaluation device 1 is implemented as a program to which a CPU (not shown) refers in order to perform the floor plan evaluation method of the first preferred embodiment.

Hereinafter, the floor plan evaluation method of the first preferred embodiment will be discussed in detail with reference to figures.

First, discussion will be made on a step (the first step) of extracting a plurality of specified elements from data on a floor plan. A specified element extraction portion 2 included in the floor plan evaluation device 1 of FIG. 14 executes the first step on the basis of data D1 on a floor plan, which is inputted from a not-shown floor planning portion.

Figure 1:
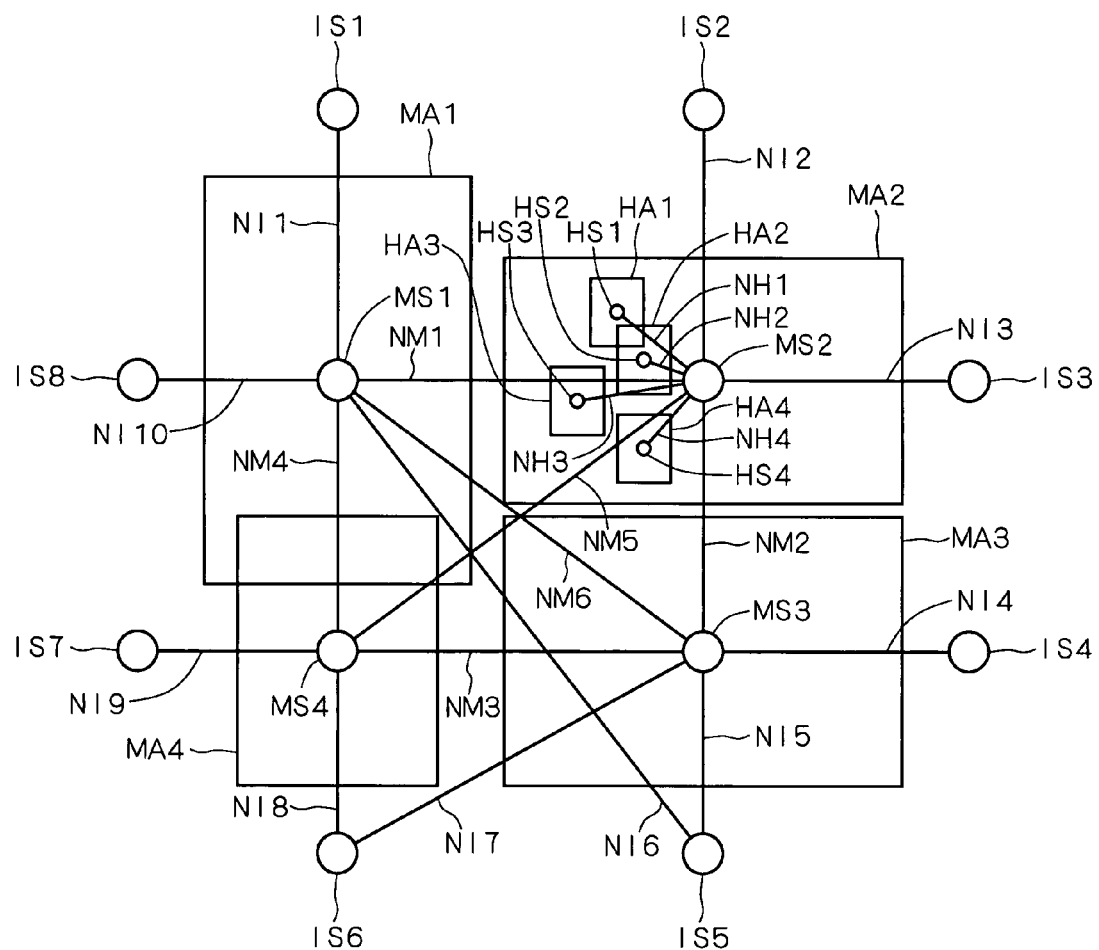
FIG. 1 is a schematic diagram illustrating a step of extracting a plurality of specified elements in a floor plan evaluation method in accordance with a first preferred embodiment of the present invention.

FIG. 1 is a schematic diagram illustrating the first step. In an exemplary case of FIG. 1, (X) arrangement information, (Y) connection information and (Z) group information, roughly classified, are extracted as the specified elements.

(X) Arrangement Information

As the arrangement information, barycentric positions IS1 to IS8 of IO buffer cells, regions HA1 to HA4 where hard macro cells are arranged, barycentric positions HS1 to HS4 of hard macro cells, regions MA1 to MA4 where logic modules are arranged and barycentric positions MS1 to MS4 of logic modules are extracted. In the case of FIG. 1, for easy discussion, the regions HA1 to HA4 and MA1 to MA4 are each approximated to a rectangle. Therefore, the barycentric positions HS1 to HS4 and MS1 to MS4 are each defined as a point of intersection of two diagonal lines of each rectangle. Instead of the barycentric positions IS1 to IS8, HS1 to HS4 and MS1 to MS4, any representative points which represent the IO buffer cells, the hard macro cells and the logic modules may be extracted. In the present first preferred embodiment and the second preferred embodiment discussed later, however, discussion will be made on an exemplary case where the barycentric positions IS1 to IS8, HS1 to HS4 and MS1 to MS4 are extracted as the representative points. Though not shown in FIG. 1, regions where the IO buffer cells are arranged, like the logic modules and the hard macro cells, may be extracted as the specified elements.

(Y) Connection Information

As the connection information, virtual lines (in general, also referred to as "fly lines") NI1 to NI10 connecting the barycentric positions IS1 to IS8 of the IO buffer cells and the barycentric positions MS1 to MS4 of the logic modules, virtual lines NM1 to NM6 connecting the barycentric positions MS1 to MS4 of the logic modules to one another, and virtual lines NH1 to NH4 connecting the barycentric positions HS1 to HS4 of the hard macro cells and the barycentric positions MS1 to MS4 of the logic modules are extracted. For example, the virtual line NI1 connects the barycentric position IS1 and the barycentric position MS1, the virtual line NM1 connects the barycentric position MS1 and the barycentric position MS2 and the virtual line NH1 connects the barycentric position HS1 and the barycentric position MS2.

(Z) Group Information

As the group information, if a plurality of hard macro cells belonging to one group are specified in making a floor plan, on the basis of information on the designation, the hard macro cells belonging to the same group are extracted from the floor plan. In the case of FIG. 1, the four hard macro cells corresponding to the regions HA1 to HA4 are extracted as the hard macro cells belonging to the same group (see FIG. 6 discussed later).

Other than the group of hard macro cells, the group information may include a group of logic modules, a group of IO buffer cells and logic modules and a group of logic modules and hard macro cells. As the group of logic modules, if a plurality of logic modules belonging to one group are specified in making a floor plan, on the basis of information on the designation, the logic modules belonging to the same group are extracted from the floor plan. Similarly, as the group of IO buffer cells and logic modules, if one or more IO buffer cells and one or more logic modules which belong to one group are specified in making a floor plan, on the basis of information on the designation, the IO buffer cells and the logic modules which belong to the same group are extracted from the floor plan. Similarly, as the group of logic modules and hard macro cells, if one or more logic modules and one or more hard macro cells which belong to one group are specified in making a floor plan, on the basis of information on the designation, the logic modules and the hard macro cells which belong to the same group are extracted from the floor plan. For easy discussion, however, in the floor plan evaluation method of the first preferred embodiment, the group of logic modules, the group of IO buffer cells and logic modules or the group of logic modules and hard macro cells is not specified.

Next, discussion will be made on a step (the second step) of obtaining an individual evaluation value on each of a plurality of individual evaluation items on the basis of a plurality of specified elements extracted in the above first step. An individual evaluation value calculation portion 3 included in the floor plan evaluation device 1 of FIG. 14 executes the second step on the basis of data D2 on the specified elements, which is inputted from the specified element extraction portion 2.

FIGS. 2 to 6 are schematic diagrams illustrating the second step. The individual evaluation items assumed in the floor plan evaluation method of the first preferred embodiment are roughly classified into (A) the length of virtual lines, (B) the number of intersections of virtual lines, (C) the relation of logic modules, (D) the relation of hard macro cells and (E) the area of a group region. These individual evaluation items will be sequentially described below.

(A) The Length of Virtual Lines

With reference to FIG. 2, the total length of virtual lines NI1 to NI10 connecting the barycentric positions IS1 to IS8 of the IO buffer cells and the barycentric positions MS1 to MS4 of the logic modules is calculated and the value of an individual evaluation item Lio on the length of the virtual lines NI1 to NI10 is thereby obtained. In this description, a value of an individual evaluation item is defined as an "individual evaluation value" and reference signs of the individual evaluation values are the same as those of the individual evaluation items. Specifically, the value of the individual evaluation item Lio is the individual evaluation value Lio. The same applies to all the individual evaluation items and the individual evaluation values discussed later.

Though it is assumed that each of the virtual lines NI1 to NI10 is a 1-bit single line in the floor plan evaluation method of the first preferred embodiment, if each of the virtual lines NI1 to NI10 is a bundle of lines (wiring harness) having a plurality of bits, the individual evaluation value Lio is calculated in consideration of the number of bits. For example, if each of the virtual lines NI1 to NI10 is a bundle of lines having 10 bits, the individual evaluation value Lio is ten times as much as the individual evaluation value Lio for a single line. The same applies to individual evaluation values Lmod and Lhm discussed later.

Similarly, the total length of virtual lines NM1 to NM6 connecting the barycentric positions MS1 to MS4 of the logic modules to one another is calculated and an individual evaluation value Lmod on the length of the virtual lines NM1 to NM6 is thereby obtained.

Similarly, the total length of virtual lines NH1 to NH4 connecting the barycentric positions HS1 to HS4 of the hard macro cells and the barycentric position MS2 of the logic module is calculated and an individual evaluation value Lhm on the length of the virtual lines NH1 to NH4 is thereby obtained.

(B) The Number of Intersections of Virtual Lines

With reference to FIG. 3, the number of intersections of the virtual lines NI1 to NI10 connecting the barycentric positions IS1 to IS8 of the IO buffer cells and the barycentric positions MS1 to MS4 of the logic modules is obtained and an individual evaluation value Cio is thereby obtained. In a case of FIG. 3, since there is only one intersection CI1 of the virtual lines NI6 and NI7, the individual evaluation value Cio is "1". If each of the virtual lines NI1 to NI10 is a bundle of lines having a plurality of bits, the individual evaluation value Cio is obtained in consideration of the number of bits. For example, if each of the virtual lines NI6 and NI7 is a bundle of lines having 10 bits, the individual evaluation value Cio is "100" (=10×10). The same applies to individual evaluation values Cmod and Ciomod discussed later.

Similarly, the number of intersections of the virtual lines NM1 to NM6 connecting the barycentric positions MS1 to MS4 of the logic modules to one another is obtained and an individual evaluation value Cmod is thereby obtained. In a case of FIG. 3, since there is only one intersection CM1 of the virtual lines NM5 and NM6, the individual evaluation value Cmod is "1".

Similarly, the number of intersections of the virtual lines NI1 to NI10 connecting the barycentric positions IS1 to IS8 of the IO buffer cells and the barycentric positions MS1 to MS4 of the logic modules and the virtual lines NM1 to NM6 connecting the barycentric positions MS1 to MS4 of the logic modules to one another is obtained and an individual evaluation value Ciomod is thereby obtained. In the case of FIG. 3, since there are an intersection CIM1 of the virtual lines NI6 and NM5 and an intersection CIM2 of the virtual lines NI6 and NM3, the individual evaluation value Ciomod is "2".

(C) Relation of Logic Modules

With reference to FIG. 4, an overlapped area of regions MA1 to MA4 where logic modules are arranged is calculated and an individual evaluation value Omod is thereby obtained. In a case of FIG. 4, the area of a region OMI where the regions MA1 and MA4 overlap each other is calculated as the individual evaluation value Omod.

If regions where the IO buffer cells are arranged are extracted as the specified element, like the case of the overlapped area of the logic modules, an overlapped area of the IO buffer cells and the logic modules may be added as an individual evaluation item. In this case, an overlapped area of the regions where the IO buffer cells are arranged and the regions MA1 to MA4 where the logic modules are arranged is calculated and the additional individual evaluation value is thereby obtained.

Further, the total number of the virtual lines NI1 to NI10 passing over one logic module and connecting the barycentric positions IS1 to IS8 of the IO buffer cells and the barycentric positions MS1 to MS4 of other logic modules and the virtual lines NM1 to NM6 passing over one logic module and connecting the barycentric positions MS1 to MS4 of other logic modules to one another is obtained and an individual evaluation value Tmod is thereby obtained. In the case of FIG. 4, since a portion TM1 of the virtual line NI6 passes over the region MA3 and a portion TM2 of the virtual line NM5 passes over the region MA1, the individual evaluation value Tmod is "2". If each of the virtual lines NI6 and NM5 is a bundle of lines having a plurality of bits, the individual evaluation value Tmod is obtained in consideration of the number of bits. For example, if each of the virtual lines NI6 and NM5 is a bundle of lines having 10 bits, the individual evaluation value Tmod is "20" (=2×10).

(D) Relation of Hard Macrocells

With reference to FIG. 5, an overlapped area of regions HA1 to HA4 where hard macro cells are arranged is calculated and an individual evaluation value Ohm is thereby obtained. In a case of FIG. 5, the area of a region OH1 where the regions HA1 and HA2 overlap each other is calculated as the individual evaluation value Ohm.

If regions where the IO buffer cells are arranged are extracted as the specified element, like the case of the overlapped area of the hard macro cells, an overlapped area of the IO buffer cells and the hard macro cells may be added as an individual evaluation item. In this case, an overlapped area of the regions where the IO buffer cells are arranged and the regions HA1 to JA4 where the hard macro cells are arranged is calculated and the additional individual evaluation value is thereby obtained.

Further, the total number of the virtual lines NI1 to NI10 passing over a hard macro cell and connecting the barycentric positions IS1 to IS8 of the IO buffer cells and the barycentric positions MS1 to MS4 of the logic modules and the virtual lines NM1 to NM6 passing over a hard macro cell and connecting the barycentric positions MS1 to MS4 of the logic modules to one another is obtained and an individual evaluation value Thm is thereby obtained. In the case of FIG. 5, since a portion TH1 of the virtual line NM1 passes over the region HA3, a portion TH2 of the virtual line NM1 passes over the region HA2 and a portion TH3 of the virtual line NM5 passes over the region HA4, the individual evaluation value Thm is "3". If each of the virtual lines NM1 and NM5 is a bundle of lines having a plurality of bits, the individual evaluation value Thm is obtained in consideration of the number of bits. For example, if each of the virtual lines NM1 and NM5 is a bundle of lines having 10 bits, the individual evaluation value Thm is "30" (=3×10).

(E) The Area of Group Region

As discussed above, in the floor plan evaluation method of the first preferred embodiment, in making a floor plan, four hard macro cells corresponding to the regions HA1 to HA4 are specified as hard macro cells belonging to one group. Then, in the first step of extracting the specified elements from the floor plan, the four hard macro cells corresponding to the regions HA1 to HA4 are extracted as the hard macro cells belonging to the same group.

Figure 6:
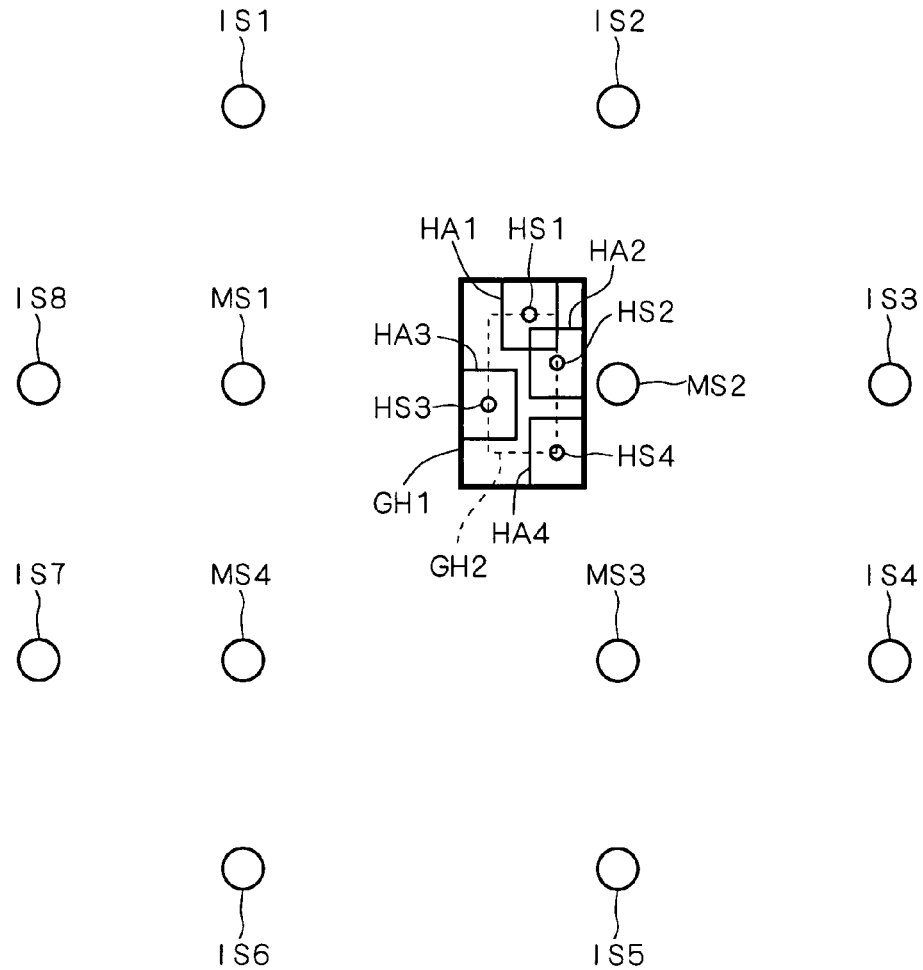

With reference to FIG. 6, a rectangle region GH1 is obtained on the basis of the regions HA1 to HA4 and an area of the region GH1 is calculated. An individual evaluation value Ghm on the area of the hard macro cell group is thereby obtained. Part of an upper side of the region GH1 overlaps an upper side of the region HA1, part of a left side of the region GH1 overlaps a left side of the region HA3, part of a lower side of the region GH1 overlaps a lower side of the region HA4, and parts of a right side of the region GH1 overlap right sides of the regions HA2 and HA4. In this description, the positional relation of the regions HA1 to HA4 and the region GH1 is defined as "the region GH1 is 'inscribed' by the regions HA1 to HA4" meaning that the sides of the regions HA1 to HA4 included in the region GH1 are tangent to the sides of the region GH1. Further, there may be a case where instead of the region GH1 inscribed by the regions HA1 to HA4, a rectangle region GH2 whose sides pass over the barycentric positions HS1 to HS4 (of the regions HA1 to HA4) is obtained and an area of the region GH2 is calculated. The same applies to individual evaluation values Gmod, Giomod and Gmodhm discussed later.

Like the case of the hard macro cell group, if a logic module group is specified, an area of a region where the logic modules belonging to one group are arranged is added as an individual evaluation item Gmod and the value of the area is calculated as an individual evaluation value Gmod.

Further, if a group of the IO buffer cells and the logic modules is specified, an area of a region where the IO buffer cells and the logic modules belonging to one group are arranged is added as an individual evaluation item Giomod and the value of the area is calculated as an individual evaluation value Giomod.

Furthermore, if a group of the logic modules and the hard macro cells is specified, an area of a region where the logic modules and the hard macro cells belonging to one group are arranged is added as an individual evaluation item Gmodhm and the value of the area is calculated as an individual evaluation value Gmodhm.

Though the individual evaluation values Lio, Lmod, Lhm, Cio, Cmod, Ciomod, Omod, Tmod, Ohm, Thm, Ghm, Gmod, Giomod and Gmodhm which are obtained on the basis of a plurality of specified elements extracted in the first step have been described above, all these individual evaluation values do not necessarily have to be obtained and some of a plurality of individual evaluation values which are specified in advance may be obtained.

Next, discussion will be made on a step (the third step) of calculating an integrated evaluation value on a floor plan on the basis of a plurality of individual evaluation values obtained in the above-discussed second step. An integrated evaluation value calculation portion 4 included in the floor plan evaluation device 1 of FIG. 14 executes the third step on the basis of data D3 on the individual evaluation values, which is inputted from the individual evaluation value calculation portion 3.

As shown in the following equation Eq. (1), in the third step, the integrated evaluation value (hereinafter, referred to as "total score") S on a floor plan to be evaluated is calculated by adding up the individual evaluation values Lio, Lmod, Lhm, Cio, Cmod, Ciomod, Omod, Tmod, Ohm, Thm, Ghm, Gmod, Giomod and Gmodhm which are obtained in the above second step.

$$S = Lio \times W1 + Lmod \times W2 + Lhm \times W3 + Cio \times W4 + Cmod \times W5 + Ciomod \times W6 + Omod \times W7 + Tmod \times W8 + Ohm \times W9 + Thm \times W10 + Ghm \times W11 + Gmod \times W12 + Giomod \times W13 + Gmodhm \times W14 \quad (1)$$

In Eq. (1), W1 to W14 are each a value for weighting in accordance with the degree of significance of the corresponding individual evaluation item and the value is set larger as the degree of significance of the corresponding item is higher.

In the floor plan evaluation method of the first preferred embodiment, by executing the above-discussed first to third steps for a plurality of floor plans, the respective total scores S on the floor plans are obtained. The integrated evaluation value calculation portion 4 included in the floor plan evaluation device 1 of FIG. 14 outputs data D4 on the total score S. Then, by comparing the values of a plurality of total scores S with one another, it is evaluated that a floor plan having a total score S of smaller value should be superior.

Hereinafter, with a simple floor plan taken as an example, a specific case of calculating a total score S will be discussed.

Figure 7:
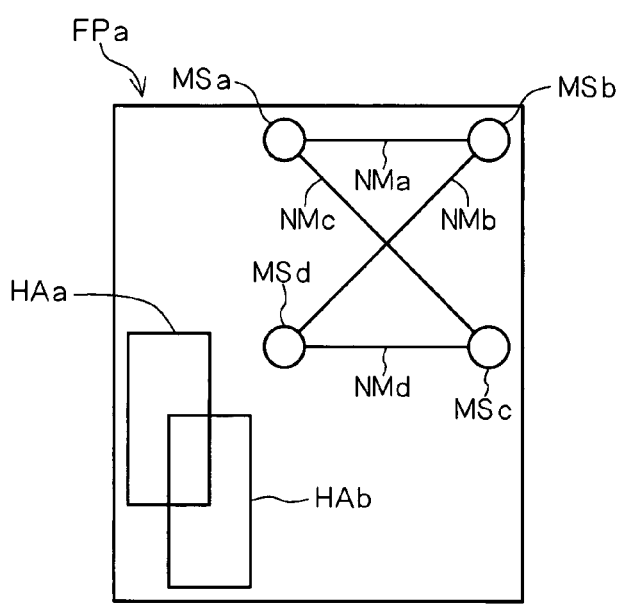
FIG. 7 is a schematic diagram showing a state where the specified elements are extracted from a first floor plan in the floor plan evaluation method in accordance with the first preferred embodiment of the present invention.

FIG. 7 is a schematic diagram showing a state where specified elements are extracted from a floor plan FPa. In an exemplary case of FIG. 7, regions HAa and HAb where hard macro cells are arranged, barycentric positions MSa to MSd of logic modules, virtual lines NMa to NMd connecting the barycentric positions MSa to MSd of the logic modules and a hard macro cell group corresponding to the regions HAa and HAb are extracted as the specified elements. It is assumed that the virtual lines NMa to NMd are each a single line of 1 bit.

Figure 8:
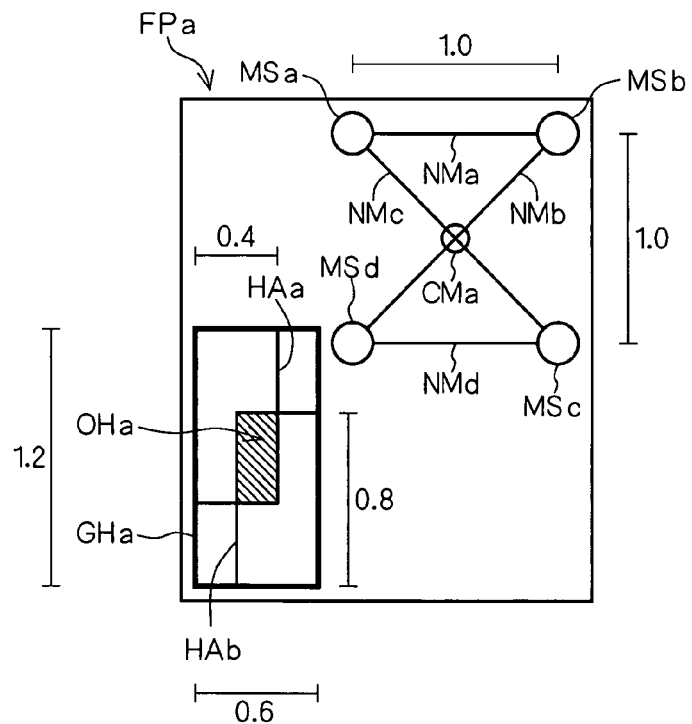
FIG. 8 is a schematic diagram showing a state where individual evaluation values are obtained on the first floor plan in the floor plan evaluation method in accordance with the first preferred embodiment of the present invention.

FIG. 8 is a schematic diagram showing a state where individual evaluation values are obtained on the floor plan FPa. The individual evaluation value Lmod which is the total length of virtual lines NMa to NMd is "4.82" (=1.00+1.00+1.41+1.41). Since an intersection CMa of the virtual lines NMb and NMc exists in this floor plan, the individual evaluation value Cmod is "1". The individual evaluation value Ohm which is an area of a region OHa where the regions HAa and HAb overlap each other is "0.08" (=0.2×0.4). The individual evaluation value Ghm which is an area of a region GHa in which the regions HAa and HAb are inscribed is "0.72" (=0.6×1.2). Therefore, the total score S on the floor plan FPa is "6.62" (=4.82+1+0.08+0.72). The values of weightings W2, W5, W9 and W11 for the individual evaluation values Lmod, Cmod, Ohm and Ghm in the above Eq. (1) are each set to "1".

Figure 9:
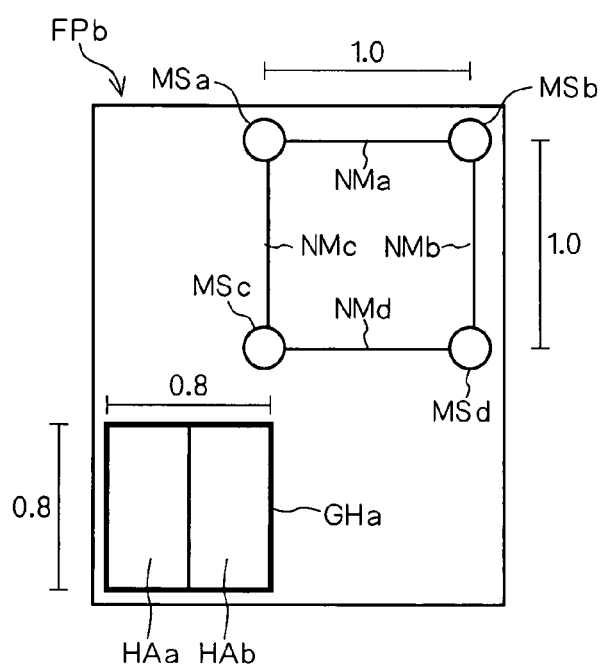
FIG. 9 is a schematic diagram showing a state where individual evaluation values are obtained on a second floor plan in the floor plan evaluation method in accordance with the first preferred embodiment of the present invention.

FIG. 9 is a schematic diagram showing a state where individual evaluation values are obtained on a floor plan FPb like the floor plan FPa. The individual evaluation value Lmod which is the total length of the virtual lines NMa to NMd is "4.00" (=1.00+1.00+1.00+1.00). Since the virtual lines NMa to NMd do not intersect one another, the individual evaluation value Cmod is "0". Since the regions HAa and HAb do not overlap each other, the individual evaluation value Ohm is "0.00". The individual evaluation value Ghm which is an area of the region GHa in which the regions HAa and HAb are inscribed is "0.64" (=0.8×0.8). Therefore, the total score S on the floor plan FPb is "4.64" (=4.00+0+0.00+0.64).

Since the total score S on the floor plan FPb (=4.64) is smaller than the total score S on the floor plan FPa (=6.62), it is evaluated that the floor plan FPb is superior to the floor plan FPa.

Thus, in the floor plan evaluation method of the first preferred embodiment, a plurality of specified elements are extracted from a floor plan in the first step, a plurality of individual evaluation values are obtained in the second step and a total score S is calculated in the third step. Then, the values of a plurality of total scores S which are obtained by executing the first to third steps for a plurality of floor plans are compared with one another to relatively evaluate these floor plans. Therefore, without detailed placement and routing for evaluation of a floor plan, it is possible to quantitatively evaluate the floor plan which is made, with the value of its total score S, and this allows significant reduction in design period.

Further, since the individual evaluation items include the length of virtual lines, it is possible to quantitatively evaluate a floor plan in consideration of some problems such as timing. Since the individual evaluation items include the number of intersections of virtual lines, the relation of logic modules and the relation of hard macro cells, it is possible to quantitatively evaluate a floor plan in consideration of some problems such as wiring congestion. Furthermore, since the individual evaluation items include the area of a group region, it is possible to quantitatively evaluate a floor plan in consideration of some problems of product performance such as power consumption.

The Second Preferred Embodiment

In the second preferred embodiment, a floor plan correction method using the floor plan evaluation method of the first preferred embodiment will be discussed.

Figure 15:
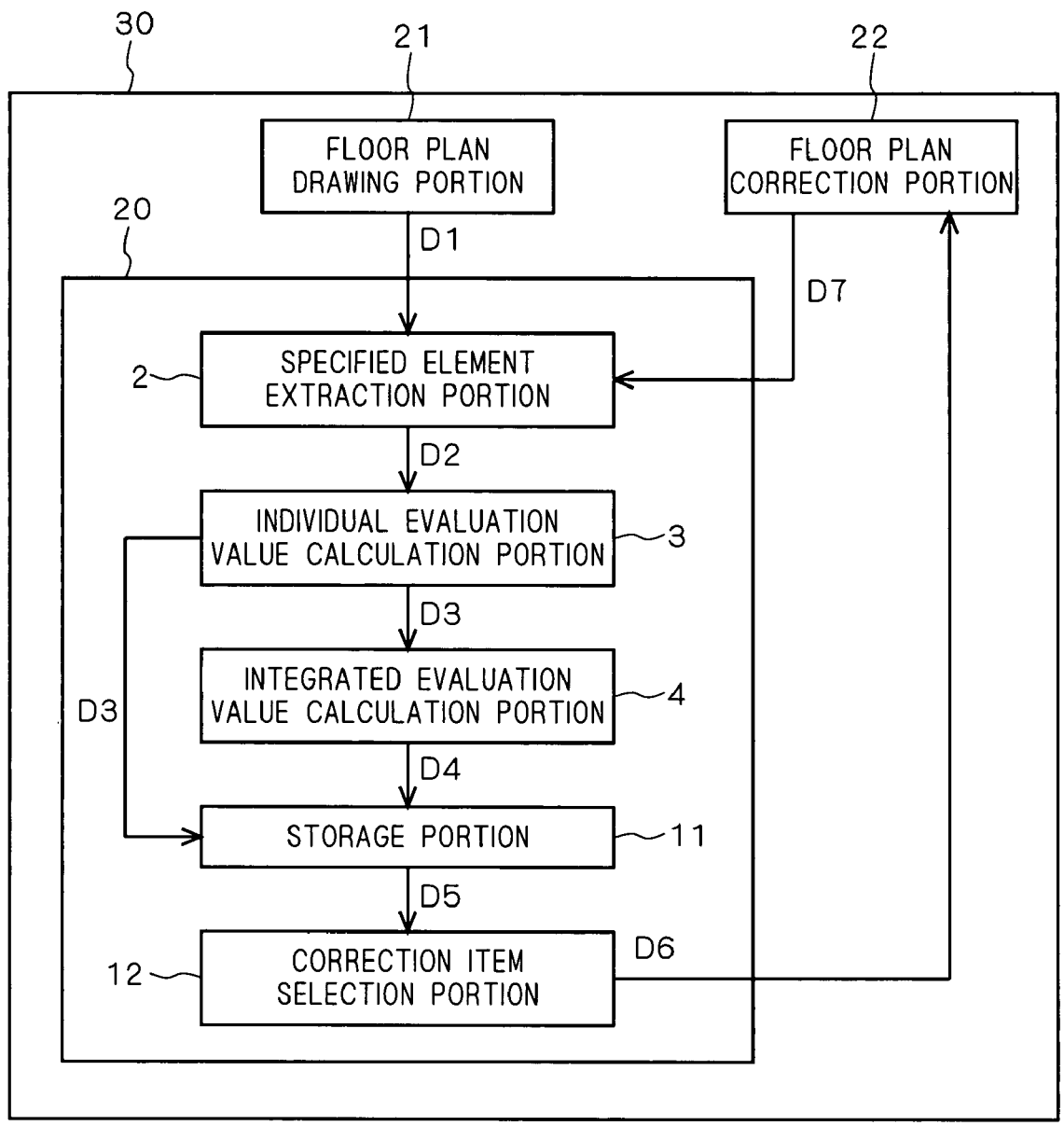
FIG. 15 is a block diagram showing a constitution of a floor planning device in accordance with the second preferred embodiment of the present invention.

FIG. 15 is a functional block diagram showing a constitution of a floor planning device 30 in accordance with the second preferred embodiment. The floor planning device 30 has a floor plan evaluation portion 20, a floor planning portion 21 and a floor plan correction portion 22. The floor plan evaluation portion 20 and the floor plan correction portion 22 are implemented as a program to which a CPU (not shown) refers in order to perform the floor plan correction method of the second preferred embodiment.

Figure 10:
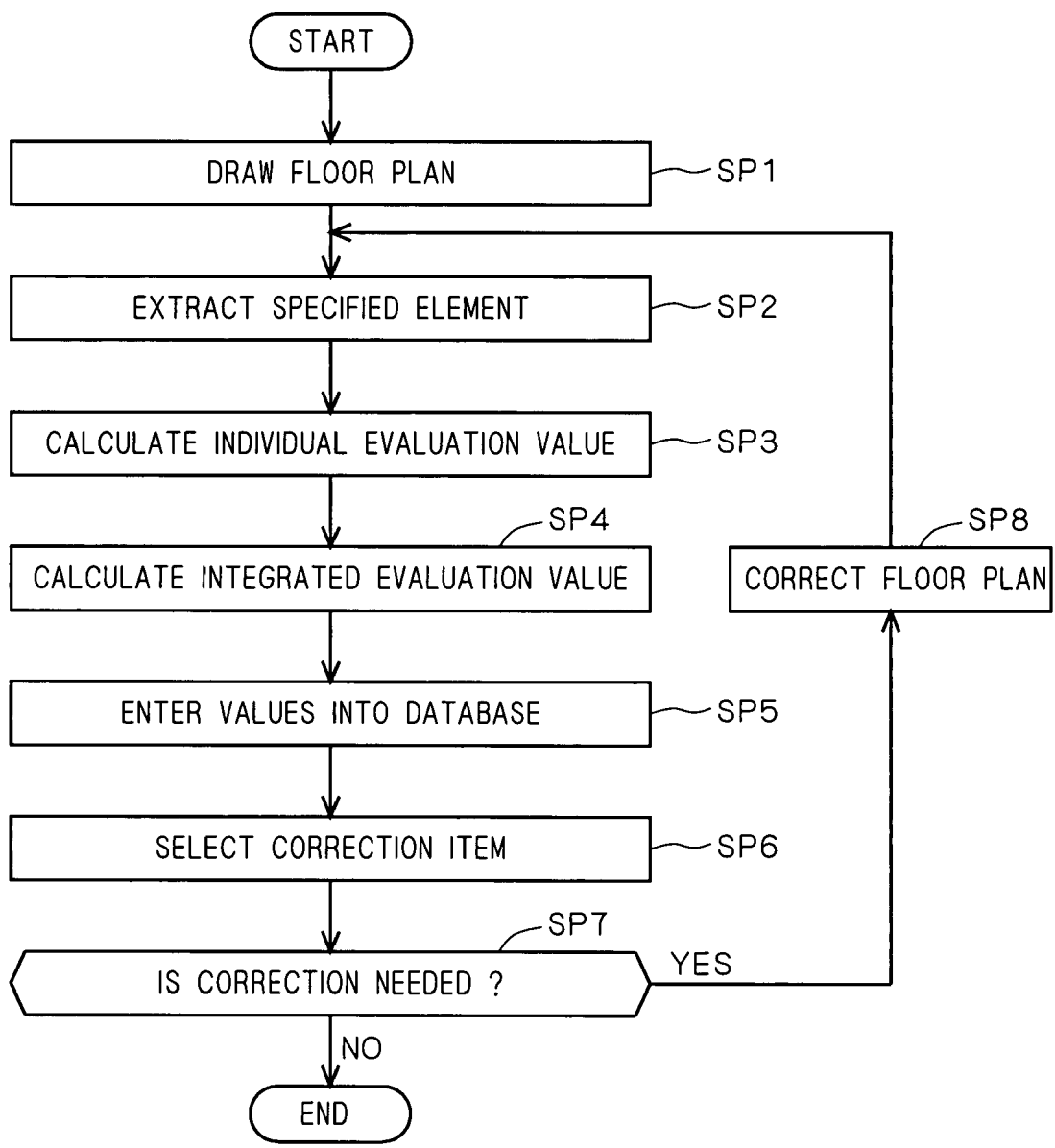
FIG. 10 is a flowchart showing an operation flow in a floor plan correction method in accordance with a second preferred embodiment of the present invention.
Figure 11:
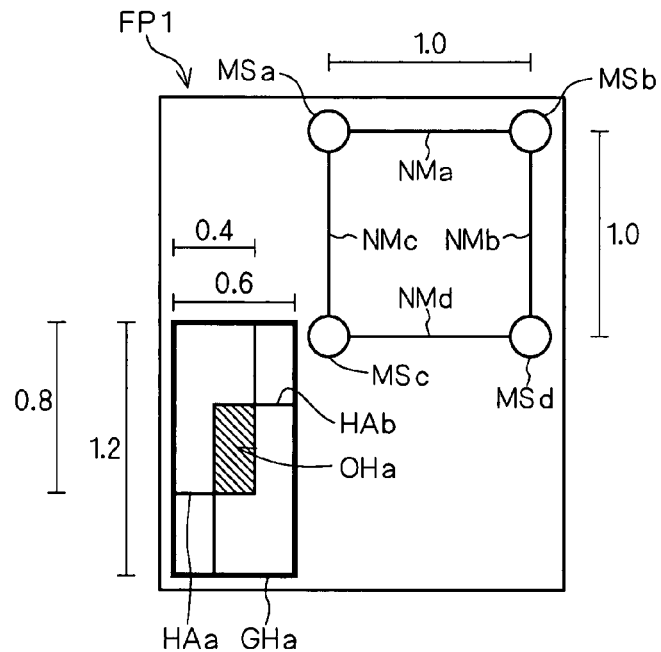
FIG. 11 is a schematic diagram showing a state where individual evaluation values are obtained on the first floor plan in the floor plan correction method in accordance with the second preferred embodiment of the present invention.
Figure 12:
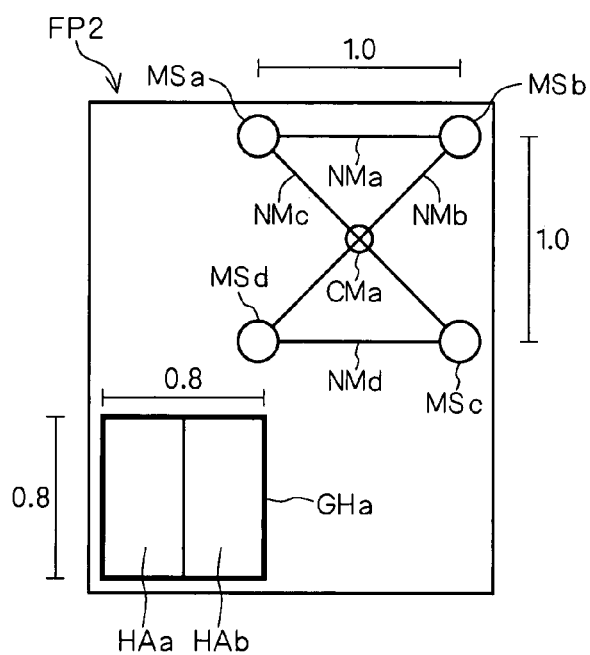
FIG. 12 is a schematic diagram showing a state where individual evaluation values are obtained on the second floor plan in the floor plan correction method in accordance with the second preferred embodiment of the present invention.

FIG. 10 is a flowchart showing an operation flow in the floor plan correction method in accordance with the second preferred embodiment, and FIGS. 11 and 12 are schematic diagrams showing states where individual evaluation values are obtained on the first and second floor plans, respectively. The operations of Steps SP1 to SP4 in the flowchart of FIG. 10 are the same as those in the above-discussed first preferred embodiment.

First, in Step SP1, the floor planning portion 21 included in the floor planning device 30 of FIG. 15 makes a plurality of floor plans. Herein, for easy discussion, it is assumed that the two floor plans FP1 and FP2 shown in FIGS. 11 and 12 are made.

Next, in Step SP2 corresponding to the above first step, a plurality of specified elements which are specified in advance are extracted for each of the floor plans FP1 and FP2. The specified element extraction portion 2 included in the floor planning device 30 of FIG. 15 executes Step SP2 on the basis of the data D1 on the floor plans, which is inputted from the floor planning portion 21.

In cases of FIGS. 11 and 12, the regions HAa and HAb where the hard macro cells are arranged, the barycentric positions MSa to MSd of the logic modules, the virtual lines NMa to NMd connecting the barycentric positions MSa to MSd of the logic modules to one another, and the hard macro cell group corresponding to the regions HAa and HAb are extracted as the specified elements. It is assumed that the virtual lines NMa to NMd are each a single line of 1 bit.

Next, in Step SP3 corresponding to the above second step, a plurality of individual evaluation values are obtained on the basis of a plurality of specified elements extracted in Step SP2 for each of the floor plans FP1 and FP2. The individual evaluation value calculation portion 3 included in the floor planning device 30 of FIG. 15 executes Step SP3 on the basis of the data D2 on the specified elements, which is inputted from the specified element extraction portion 2.

On the floor plan FP1 shown in FIG. 11, the individual evaluation value Lmod which is the total length of the virtual lines NMa to NMd is "4.00". Since the virtual lines NMa to NMd do not intersect one another, the individual evaluation value Cmod is "0". The individual evaluation value Ohm which is the area of the region OHa where the regions HAa and HAb overlap each other is "0.08". The individual evaluation value Ghm which is the area of the region GHa in which the regions HAa and HAb are inscribed is "0.72".

On the floor plan FP2 shown in FIG. 12, the individual evaluation value Lmod which is the total length of the virtual lines NMa to NMd is "4.82". Since the intersection CMa of the virtual lines NMb and NMc exists in this floor plan, the individual evaluation value Cmod is "1". Since the regions HAa and HAb do not overlap each other, the individual evaluation value Ohm is "0.00". The individual evaluation value Ghm which is the area of the region GHa in which the regions HAa and HAb are inscribed is "0.64".

Next, in Step SP4 corresponding to the third step, a total score S is calculated on the basis of a plurality of individual evaluation values obtained in Step SP3 for each of the floor plans FP1 and FP2. The integrated evaluation value calculation portion 4 included in the floor planning device 30 of FIG. 15 executes Step SP4 on the basis of the data D3 on the individual evaluation values, which is inputted from the individual evaluation value calculation portion 3.

The total score S on the floor plan FP1 shown in FIG. 11 is "4.80" (=4.00+0+0.08+0.72). The total score S on the floor plan FP2 shown in FIG. 12 is "6.46" (=4.82+1+0.00+0.64). The values of weightings W2, W5, W9 and W11 for the individual evaluation values Lmod, Cmod, Ohm and Ghm in the above Eq. (1) are each set to "1".

Next, in Step SP5, for each of the floor plans FP1 and FP2, a plurality of individual evaluation values obtained in Step SP2 and the total score S obtained in Step SP3 are entered into a database. With reference to FIG. 15, the data D3 on the individual evaluation values, which is outputted from the individual evaluation value calculation portion 3, and the data D4 on the integrated evaluation values, which is outputted from the integrated evaluation value calculation portion 4, are inputted to a storage portion 11 which corresponds to the above database. Though a constitution in which the storage portion 11 is disposed inside the floor planning device 30 is shown in FIG. 15, the storage portion 11 may be disposed outside the floor planning device 30.

Figure 13:
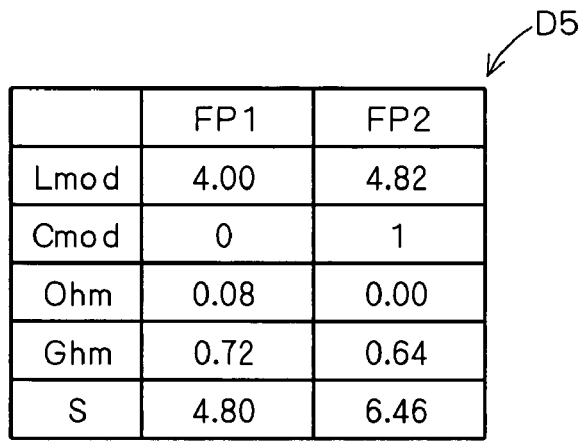
FIG. 13 is a view showing data entered in a database in the floor plan correction method in accordance with the second preferred embodiment of the present invention.

FIG. 13 is a view showing data D5 which is generated on the basis of the data D3 and D4 and entered into the database. In the database, the individual evaluation items Lmod, Cmod, Ohm and Ghm, the individual evaluation values Lmod, Cmod, Ohm and Ghm and the total score S on each of the floor plans FP1 and FP2 are stored.

Next, in Step SP6, one or more individual evaluation items to be corrected are selected out of the individual evaluation items Lmod, Cmod, Ohm and Ghm on the basis of the content of the data D5 shown in FIG. 13, which is stored in the database. A correction item selection portion 12 included in the floor planning device 30 of FIG. 15 executes Step SP6 on the basis of the data D5 inputted from the storage portion 11.

With reference to FIG. 13, since the total score S on the floor plan FP1 (=4.80) is smaller than the total score S on the floor plan FP2 (=6.46), it is evaluated that the floor plan FP1 should be superior to the floor plan FP2 on the whole. Since the individual evaluation values Ohm and Ghm of the floor plan FP1 are larger than those of the floor plan FP2, however, the individual evaluation items Ohm and Ghm of the floor plan FP1 can be improved. Then, the individual evaluation items Ohm and Ghm of the floor plan FP1 are selected as the individual evaluation items to be corrected.

Specifically, in the case of FIG. 13, the optimum value (minimum value) of the individual evaluation item Ohm is "0.00" of the floor plan FP2 and the optimum value of the individual evaluation item Ghm is "0.64" of the floor plan FP2. Then, the individual evaluation items to be corrected are selected so that the individual evaluation value Ohm (=0.08) and the individual evaluation value Ghm (=0.72) of the floor plan FP1 may become the optimum values, i.e., the individual evaluation value Ohm (=0.00) and the individual evaluation value Ghm (=0.64) of the floor plan FP2, respectively.

Though it is assumed that there are only two floor plans FP1 and FP2 and only four individual evaluation items Lmod, Cmod, Ohm and Ghm in the case of FIG. 13, for easy discussion, actually, the number of floor plans and the number of individual evaluation values are larger. Therefore, when a particular individual evaluation value is corrected to be an optimum value, sometimes, any of the other individual evaluation values increases and consequently the total score S disadvantageously increases. Then, in such a case, the correction where a particular individual evaluation value should be an optimum value is not appropriate.

Therefore, in the case of FIG. 13 as an example, in generalizing a method of selecting individual evaluation items to be corrected, the individual evaluation items to be corrected are selected so that the individual evaluation values Ohm and Ghm of the floor plan FP1 may approximate the individual evaluation values Ohm and Ghm of the floor plan FP2, respectively.

Further, if a plurality of individual evaluation items can not be corrected at the same time or if the total score S increases when a plurality of individual evaluation items are corrected, the degree of significance is set in advance for each of the individual evaluation items Lmod, Cmod, Ohm and Ghm and an individual evaluation item whose degree of significance is higher may be selected with higher priority as the individual evaluation item to be corrected.

In the case of FIG. 13, candidates to be selected as the individual evaluation items to be corrected are the individual evaluation items Ohm and Ghm of the floor plan FP1. If there is a restriction that overlapping of the hard macro cells is not allowed, the degree of significance for the individual evaluation item Ohm is set higher than that of the individual evaluation item Ghm. Therefore, in this case, the individual evaluation item Ohm of the floor plan FP1 is first selected as the individual evaluation item to be corrected.

Thus, by setting the degree of significance for each of a plurality of individual evaluation items and selecting an individual evaluation item whose degree of significance is higher with higher priority as the individual evaluation item to be corrected, it is possible to automatically select a correction item in consideration of various conditions of a user such as restriction on product layout and this ensures an increase in convenience of the user.

Back to the flowchart of FIG. 10, when the individual evaluation item to be corrected is selected in Step SP6, it is subsequently judged if the floor plan needs to be corrected in Step SP7. For example, the maximum value for the number of repeats in correction or the maximum value of time required for correction is set in advance, and if the current number of repeats or the time which is currently taken for correction does not reach the maximum value, it is judged that the floor plan should be corrected.

If the floor plan needs to be corrected (judgment in Step SP7 is "YES"), the floor plan is corrected in Step SP8 with respect to the correction item which is selected in Step SP6. The floor plan correction portion 22 included in the floor planning device 30 of FIG. 15 executes Step SP7 on the basis of data D6 on the correction item, which is inputted from the correction item selection portion 12. For example, the individual evaluation items Ohm and Ghm of the floor plan FP1 need to be corrected, the floor plan FP1 is corrected so that the regions HAa and HAb of the floor plan FP2 shown in FIG. 12 may be adopted instead of the regions HAa and HAb of the floor plan FP1 shown in FIG. 11.

After that, for a new floor plan which is made by correcting the floor plan FP1, the operations of Steps SP2 to SP8 are performed. With reference to FIG. 15, data D7 on the corrected floor plan, which is outputted from the floor plan correction portion 22, is inputted to the specified element extraction portion 2.

If the floor plan does not need to be corrected (judgment in Step SP7 is "NO"), the processing is completed.

A tool to perform the floor plan correction method of the second preferred embodiment may be equipped in a floor planner as part of the function of the floor planner, or may be equipped as a floor plan correction tool, separately from the floor planner. If the tool is equipped as the floor plan correction tool, Steps SP1 and SP8 in the flowchart of FIG. 10 are performed by the floor planner and Steps SP2 to SP7 are performed by the floor plan correction tool.

Thus, in the floor plan correction method of the second preferred embodiment, a plurality of individual evaluation values and a plurality of total scores S on a plurality of floor plans are stored in the database. Then, on the basis of the contents stored in the database, one or more individual evaluation items to be corrected are automatically selected and the floor plan is automatically corrected with respect to the selected individual evaluation items. Therefore, since it is not necessary for a designer to find the problem by trial and error to correct the floor plan, it is possible to correct a floor plan with high efficiency and create a high-quality floor plan for a short time.

While the invention has been shown and described in detail, the foregoing description is in all aspects illustrative and not restrictive. It is therefore understood that numerous modifications and variations can be devised without departing from the scope of the invention.

The invention claimed is:

1. A floor plan correction method, comprising the steps of:
   (a) extracting a plurality of specified elements, which are specified in advance, from a floor plan;
   (b) obtaining a plurality of individual evaluation values on the basis of the plurality of specified elements extracted in the step (a), the individual evaluation values being indicative of values of the floor plan, respectively, with respect to a plurality of individual evaluation items to be considered in evaluating the floor plan;
   (c) calculating an integrated evaluation value on the floor plan on the basis of the plurality of individual evaluation values obtained in the step (b);
   (d) storing the plurality of individual evaluation values of each of a plurality of floor plans and the integrated evaluation value of each of the plurality of floor plans, which are obtained by executing the steps (a) to (c) for the plurality of floor plans;
   (e) selecting an individual evaluation item to be corrected, out of the plurality of individual evaluation items on the basis of a storage result in the step (d); and
   (f) correcting a floor plan selected among the plurality of floor plans so that the individual evaluation value of the selected floor plan approximates an optimum value among the respective individual evaluation values of the plurality of floor plans with respect to the individual evaluation item selected in the step (e), wherein
   the steps (a) to (f) are executed by a floor planning device,
   a degree of significance, which corresponds to a priority level of each of the plurality of individual evaluation items, is set for each of the plurality of individual evaluation items, and
   an individual evaluation item whose degree of significance is higher is selected with higher priority as the individual evaluation item to be corrected in the step (e).

2. The floor plan correction method according to claim 1, wherein
the plurality of specified elements include two or more of
   barycentric positions of IO buffer cells;
   regions where hard macro cells are arranged;
   barycentric positions of hard macro cells;
   regions where logic modules are arranged;
   barycentric positions of logic modules;
   virtual lines connecting barycentric positions of IO buffer cells and barycentric positions of logic modules;
   virtual lines connecting barycentric positions of logic modules to one another;
   virtual lines connecting barycentric positions of hard macro cells and barycentric positions of logic modules;
   a group of hard macro cells;
   a group of logic modules;
   a group of IO buffer cells and logic modules; and
   a group of logic modules and hard macro cells.

3. The floor plan correction method according to claim 1, wherein the plurality of individual evaluation values include two or more of
   a length of virtual lines connecting barycentric positions of IO buffer cells and barycentric positions of logic modules;
   a length of virtual lines connecting barycentric positions of logic modules to one another;
   a length of virtual lines connecting barycentric positions of hard macro cells and barycentric positions of logic modules;
   a number of intersections of virtual lines connecting barycentric positions of IO buffer cells and barycentric positions of logic modules;
   a number of intersections of virtual lines connecting barycentric positions of logic modules to one another;
   a number of intersections of virtual lines connecting barycentric positions of IO buffer cells and barycentric positions of logic modules and virtual lines connecting barycentric positions of logic modules to one another;
   an overlapped area of regions where logic modules are arranged;
   a number of virtual lines passing over one logic module and connecting barycentric positions of IO buffer cells and barycentric positions of other logic modules and virtual lines passing over the one logic module and connecting barycentric positions of other logic modules to one another;
   an overlapped area of regions where hard macro cells are arranged;
   a number of virtual lines passing over a hard macro cell and connecting barycentric positions of IO buffer cells and barycentric positions of logic modules and virtual lines passing over a hard macro cell and connecting barycentric positions of logic modules to one another;
   an area of a region where hard macro cells belonging to the same group are arranged;
   an area of a region where logic modules belonging to the same group are arranged;
   an area of a region where IO buffer cells and logic modules belonging to the same group are arranged; and
   an area of a region where logic modules and hard macro cells belonging to the same group are arranged.

4. A program executed by a floor planning device used for performing a floor plan correction method, wherein said floor plan correction method comprises the steps of:
   (a) extracting a plurality of specified elements which are specified in advance from a floor plan;
   (b) obtaining a plurality of individual evaluation values on the basis of the plurality of specified elements extracted in the step (a), the individual evaluation values being indicative of values of the floor plan, respectively, with respect to a plurality of individual evaluation items to be considered in evaluating the floor plan;

(c) calculating an integrated evaluation value on the floor plan on the basis of the plurality of individual evaluation values obtained in the step (b);

(d) storing the plurality of individual evaluation values of each of a plurality of floor plans and the integrated evaluation value of each of the plurality of floor plans, which are obtained by executing the steps (a) to (c) for the plurality of floor plans;

(e) selecting an individual evaluation item to be corrected, out of the plurality of individual evaluation items on the basis of a storage result in the step (d); and (f) correcting a floor plan selected among the plurality of floor plans so that the individual evaluation value of the selected floor plan approximates an optimum value among the respective individual evaluation values of the plurality of floor plans with respect to the individual evaluation item selected in the step (e), wherein a degree of significance, which corresponds to a priority level of each of the plurality of individual evaluation items, is set for each of the plurality of individual evaluation items, and an individual evaluation item whose degree of significance is higher is selected with higher priority as the individual evaluation item to be corrected in the step (e).

5. A floor planning device, comprising:

a floor planning portion;

a specified element extraction portion configured to extract a plurality of specified elements, which are specified in advance, from a floor plan made in the floor planning portion;

an individual evaluation value calculation portion configured to obtain a plurality of individual evaluation values on the basis of the plurality of specified elements extracted in the specified element extraction portion, the individual evaluation values being indicative of values of the floor plan, respectively, with respect a plurality of individual evaluation items to be considered in evaluating the floor plan;

an integrated evaluation value calculation portion configure to calculate an integrated evaluation value on the floor plan on the basis of the plurality of individual evaluation values obtained in the individual evaluation value calculation portion;

a storage portion configured to store the plurality of individual evaluation values of each of the plurality of individual floor plans and the integrated evaluation value of each of the plurality of floor plans;

a correction item selection portion configured to select an individual evaluation item to be corrected, out of the plurality of individual evaluation items on the basis of data stored in the storage portion; and a floor plan correction portion configured to correct a floor plan selected among the plurality of floor plans so that the individual evaluation value of the selected floor plan approximates an optimum value among the respective individual evaluation values of the plurality of floor plans with respect to the individual evaluation item selected in the correction item selection portion, wherein a degree of significance, which corresponds to a priority level of each of the plurality of individual evaluation items, is set for each of the plurality of individual evaluation items, and the correction item selection portion selects an individual evaluation item whose degree of significance is higher with higher priority as the individual evaluation item to be corrected.

6. The floor planning device according to claim 5, wherein the plurality of specified elements include two or more of barycentric positions of IO buffer cells;
regions where hard macro cells are arranged;
barycentric positions of hard macro cells;
regions where logic modules are arranged;
barycentric positions of logic modules;
virtual lines connecting barycentric positions of IO buffer cells and barycentric positions of logic modules;
virtual lines connecting barycentric positions of logic modules to one another;
virtual lines connecting barycentric positions of hard macro cells and barycentric positions of logic modules;
a group of hard macro cells;
a group of logic modules;
a group of IO buffer cells and logic modules; and
a group of logic modules and hard macro cells.

7. The floor planning device according to claim 5, wherein the plurality of individual evaluation values include two or more of a length of virtual lines connecting barycentric positions of IO buffer cells and barycentric positions of logic modules;
a length of virtual lines connecting barycentric positions of logic modules to one another;
a length of virtual lines connecting barycentric positions of hard macro cells and barycentric positions of logic modules;
a number of intersections of virtual lines connecting barycentric positions of IO buffer cells and barycentric positions of logic modules;
a number of intersections of virtual lines connecting barycentric positions of logic modules to one another;
a number of intersections of virtual lines connecting barycentric positions of IO buffer cells and barycentric positions of logic modules and virtual lines connecting barycentric positions of logic modules to one another;
an overlapped area of regions where logic modules are arranged;
a number of virtual lines passing over one logic module and connecting barycentric positions of IO buffer cells and barycentric positions of other logic modules and virtual lines passing over the one logic module and connecting barycentric positions of other logic modules to one another;
an overlapped area of regions where hard macro cells are arranged;
a number of virtual lines passing over a hard macro cell and connecting barycentric positions of IO buffer cells and barycentric positions of logic modules and virtual lines passing over a hard macro cell and connecting barycentric positions of logic modules to one another;
an area of a region where hard macro cells belonging to the same group are arranged;
an area of a region where logic modules belonging to the same group are arranged;
an area of a region where IO buffer cells and logic modules belonging to the same group are arranged; and
an area of a region where logic modules and hard macro cells belonging to the same group are arranged.

* * * * *